(12) United States Patent
Ai et al.

(10) Patent No.: US 11,315,999 B2
(45) Date of Patent: Apr. 26, 2022

(54) ARRAY SUBSTRATE, DISPLAY PANEL, DISPLAY DEVICE AND MANUFACTURING METHOD THEREOF

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Yu Ai, Beijing (CN); Xuewu Xie, Beijing (CN); Jian Wu, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 109 days.

(21) Appl. No.: 16/335,332

(22) PCT Filed: Jul. 6, 2018

(86) PCT No.: PCT/CN2018/094879
§ 371 (c)(1),
(2) Date: Mar. 21, 2019

(87) PCT Pub. No.: WO2019/042014
PCT Pub. Date: Mar. 7, 2019

(65) Prior Publication Data
US 2020/0020758 A1  Jan. 16, 2020

(30) Foreign Application Priority Data

Aug. 31, 2017 (CN) .......................... 201710774897.7

(51) Int. Cl.
*H01L 27/32* (2006.01)
*H05K 1/18* (2006.01)
*H05K 1/11* (2006.01)

(52) U.S. Cl.
CPC ...... *H01L 27/3276* (2013.01); *H01L 27/3246* (2013.01); *H05K 1/11* (2013.01);
(Continued)

(58) Field of Classification Search
CPC ............. H01L 27/3211; H01L 27/3251; H01L 27/3276; H01L 51/5253; H05K 1/11; H05K 1/18
See application file for complete search history.

(56) References Cited

U.S. PATENT DOCUMENTS

| 2009/0073366 A1* | 3/2009 | Kurozumi ........... G02F 1/13394 349/139 |
| 2014/0204324 A1* | 7/2014 | Takeguchi .......... G02F 1/13452 349/139 |

(Continued)

FOREIGN PATENT DOCUMENTS

| CN | 102033373 A | 4/2011 |
| CN | 103165525 A | 6/2013 |

(Continued)

OTHER PUBLICATIONS

PCT International Search Report, Application No. PCT/CN2018/094879, dated Oct. 12, 2018, 6 pages: with English translation.

(Continued)

*Primary Examiner* — Kenneth Parker
*Assistant Examiner* — Long H Le
(74) *Attorney, Agent, or Firm* — Armstrong Teasdale LLP (57) ABSTRACT

The disclosure provides an array substrate, a display panel, a display device, and a method for fabricating the same. The array substrate provided by the present disclosure includes a substrate, a wiring on the substrate, an insulating layer covering the wiring, and a protrusion on the insulating layer and located in a non-display region of the array substrate. Wherein the protrusion is adjacent to the wiring, and (Continued)

wherein a surface, away from the base substrate, of the protrusion is further away from the base substrate than a surface, away from the base substrate, of a portion of the first insulating layer covering the wiring.

18 Claims, 6 Drawing Sheets

(52) U.S. Cl.
CPC .......... *H05K 1/18* (2013.01); *H01L 2227/323* (2013.01); *H05K 2201/10128* (2013.01)

(56) References Cited

U.S. PATENT DOCUMENTS

| | | | | |
|---|---|---|---|---|
| 2015/0255758 A1* | 9/2015 | Hirai | ................... | H01L 51/0024 438/28 |
| 2015/0261259 A1* | 9/2015 | Endo | ....................... | G06F 3/042 361/679.06 |

FOREIGN PATENT DOCUMENTS

| | | | |
|---|---|---|---|
| CN | 103293727 A | 9/2013 | |
| CN | 107579103 A | 1/2018 | |

OTHER PUBLICATIONS

PCT Written Opinion, Application No. PCT/CN2018/094879, dated Oct. 12, 2018, 5 pages.: with English translation of relevant part.

* cited by examiner

ARRAY SUBSTRATE, DISPLAY PANEL, DISPLAY DEVICE AND MANUFACTURING METHOD THEREOF

CROSS REFERENCE TO RELATED APPLICATIONS

This patent application is a National Stage Entry of PCT/CN2018/094879 filed on Jul. 6, 2018, which claims the benefit and priority of Chinese Patent Application No. 201710774897.7 filed on Aug. 31, 2017, the disclosures of which are incorporated by reference herein in their entirety as part of the present application.

BACKGROUND

The present disclosure relates to the field of display technologies, and in particular, to an array substrate, a display panel, a display device, and a method of fabricating the same.

With the development of display technology, Organic Light-Emitting Diode (OLED) is used in an array substrate of a display device for advantages of self-luminescence, wide viewing angle, high contrast, low power consumption, and high reaction speed.

The current array substrate includes a display region and a non-display region. A thin film transistor layer, a metal anode layer, a color film layer, an organic light emitting material layer, and a metal cathode layer are formed in the display region. Data lines and a passivation layer covering and protecting the data lines are formed in the non-display region.

BRIEF DESCRIPTION

In one aspect, embodiments of the present disclosure provide an array substrate. The substrate includes a substrate, a wiring on the substrate, a first insulating layer covering the wiring, and a protrusion on the first insulating layer and located in a non-display region of the array substrate. Wherein the protrusion is adjacent to the wiring, and wherein a surface, away from the base substrate, of the protrusion is further away from the base substrate than a surface, away from the base substrate, of a portion of the first insulating layer covering the wiring.

In an embodiment, at least a portion of the orthographic projection of the signal line on the base substrate does not overlap with an orthographic projection of the protrusion on the base substrate.

In an embodiment, protrusions are disposed on both sides of the wiring; an orthographic projection of the wiring on the base substrate does not overlap with the orthographic projection of the protrusion on the base substrate.

In an embodiment, the array substrate further includes a circuit board disposed on the protrusion, a conductive portion disposed on a side, facing the wiring, of the circuit board, the conductive portion being electrically connected to the wiring through a via provided on the first insulating layer, wherein an orthographic projection of the conductive portion on the base substrate is between the orthographic projections of the protrusions on the base substrate.

In an embodiment, the thickness of the protrusion is greater than the thickness of the wiring.

In an embodiment, a package layer is provided on a display region of the array substrate, and a distance between the protrusion and the package layer is greater than a preset distance.

In an embodiment, the array substrate includes a pixel defining layer located in the display region and defining sub-pixels, wherein the pixel defining layer is disposed in the same layer as the protective layer.

In an embodiment, the array substrate further includes a metal layer between the base substrate and the wiring, and a second insulating layer between the metal layer and the wiring.

In an embodiment, the shape of the protrusion is selected from the group consisting of a sphere, a cylinder, and a cuboid.

In an embodiment, the protrusion includes a resin.

In an embodiment, the wiring includes a data line.

In an embodiment, the first insulating layer includes a passivation layer.

In another aspect, embodiments of the present disclosure provide a display panel. The display panel includes the above array substrate.

In another aspect, embodiments of the present disclosure provide a display device. The display device includes the above display panel.

In another aspect, embodiments of the present disclosure provide a method of fabricating the array substrate described above. The method for fabricating the array substrate includes forming a wiring on the base substrate, forming a first insulating layer covering the wiring on the wiring, forming a protrusion on the first insulating layer and in a non-display region of the array substrate. Wherein the protrusion is adjacent to the wiring, and wherein a surface, away from the base substrate, of the protrusion is further away from the base substrate than a surface, away from the base substrate, of a portion of the first insulating layer covering the wiring.

Forming a protrusion on the first insulating layer may include forming protrusions on the first insulating through a patterning process, the protrusions being located on both sides of the wiring.

In an embodiment, forming a protrusion on the first insulating layer includes forming a protrusion on the first insulating layer in a non-display region while forming a pixel defining layer in a display region and defining sub-pixels by one patterning process.

DETAILED DESCRIPTION

The present disclosure will be further described in detail with reference to the accompanying drawings and specific embodiments.

In the description of the present disclosure, "a plurality" means two or more unless otherwise stated. The articles "a", "an", "the" and "said" are intended to mean that there are one or more elements. The terms "comprising," "comprises," "comprising" are intended to be inclusive and indicate that there may be additional elements other than those listed.

The orientation or positional relationship of the terms "upper", "lower", "left", "right", "inside", "outside" and the like is based on the orientation or positional relationship shown in the drawings, only for convenience of description of the present disclosure, instead of indicating or implying that the machine or component referred to must have a particular orientation, constructed and operated in a particular orientation. Such description is not to be construed as limiting the disclosure.

In the description of the present disclosure, it should be noted that the terms "installation", "connected", and "coupled" are to be understood broadly. For example, it may be a fixed connection, a detachable connection, or an integral connection. For example, it may be a mechanical connection or an electrical connection. It can be directly connected or indirectly connected through an intermediate medium. The specific meaning of the above terms in the present disclosure can be understood in a specific case by those skilled in the art.

The specific embodiments of the present disclosure are further described in detail below with reference to the drawings and embodiments. The following examples are intended to illustrate the disclosure but are not intended to limit the scope of the disclosure.

In the process of fabricating the array substrate, it is necessary to form an adhesive tape on the edge of the display region of the array substrate. The attaching process of the adhesive tape and the hot pressing process may cause a large pressure to the array substrate. The adhesive tape of the display region of the array substrate can buffer the external force, thereby protecting the normal use of the lines in the display region. Data lines and the passivation layer in the non-display area are subject to relative great stress, and the passivation layer outside the data line is easily to be destroyed. As a result, the data lines in the passivation layer are corroded by the intrusion of external water vapor, thereby affecting the normal use of the array substrate.

In order to reduce the line corrosion occurring experiment or the work with a high temperature and high humidity, the embodiment of the disclosure provides an array substrate, which can be applied to a display panel and a display device.

Figure 1:
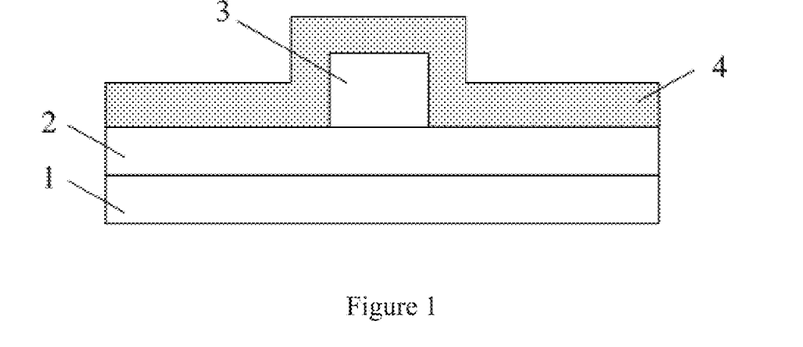
FIG. 1 is a schematic structural view of a non-display region of an array substrate according to an embodiment.

FIG. 1 is a schematic view showing a structure of a non-display region of an array substrate in an embodiment. As can be seen from FIG. 1, the structure includes a base substrate 1, a gate insulating layer 2 formed on the base substrate 1, a data line 3 on the gate insulating layer 2, and an insulating layer (for example, a passivation layer) 4 covering the data line 3. The material of the base substrate 1 may be selected from the group consisting of a plurality of materials. For example, the base substrate may include a glass rigid substrate, a flexible substrate. The passivation layer 4 may be selected from the group consisting of a plurality of materials. For example, the passivation layer may include a silicon nitride layer, a resin layer, or the like.

Figure 2:
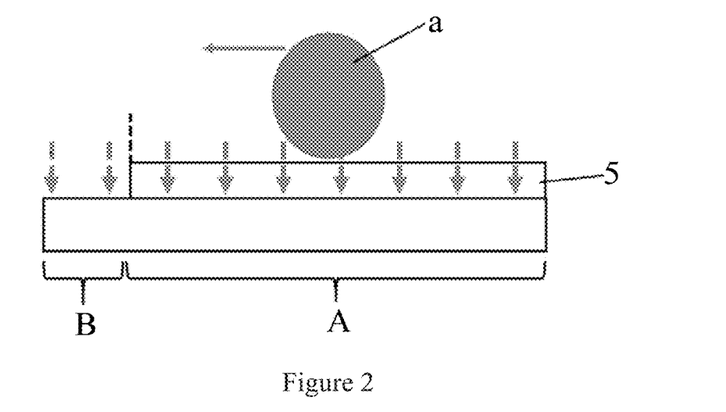
FIG. 2 is a schematic view showing a process of attaching a strip of adhesive tape when fabricating an array substrate according to an embodiment.

FIG. 2 is a schematic view showing a process of attaching an adhesive tape in an embodiment of an array substrate. As can be seen from FIG. 2, the array substrate includes a display region A and a non-display region B. A package layer 5 is disposed on the display region A. During the adhesive tape attachment process, the roller "a" will repeatedly roll over the array substrate. The horizontal arrow in FIG. 2 indicates the rolling direction of the roller a, and the vertical downward arrow indicates the direction of the force of the roller a on the array substrate. The data line 3 in the non-display region B is subjected to an external force. The passivation layer 4 outside the data line 3 in the non-display region B is easily to be damaged by an external force. The structure after the damage is as shown in FIG. 4, wherein the direction of the arrow in FIG. 4 is the direction in which the outside water vapor invades.

After the passivation layer 4 is broken, the external water vapor easily enters from the damaged portion b of the passivation layer 4 and comes into contact with the data line 3, causing the data line 3 to be corroded. Since the package layer 5 is provided in the display region A, the package layer 5 can alleviate the effect of external force on the lines and devices in the display region A, thereby protecting the normal use of the lines and devices in the display region A.

Figure 3:
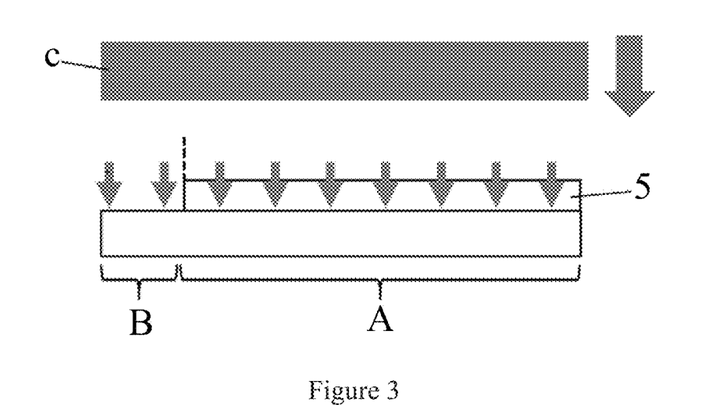
FIG. 3 is a schematic view showing a hot pressing process of an adhesive tape when fabricating an array substrate according to an embodiment.

FIG. 3 is a schematic view of a thermal pressing process of a package layer when fabricating an array substrate according to an embodiment. As can be seen from FIG. 3, the array substrate includes a display region A and a non-display region B, and the package layer 5 is disposed on the display region A. During hot pressing process to the package layer, the hot pressing device c applies a pressure on the array substrate, and the arrows in FIG. 3 indicate the moving direction of the hot pressing device c and the pressure applying direction to the array substrate.

Figure 4:
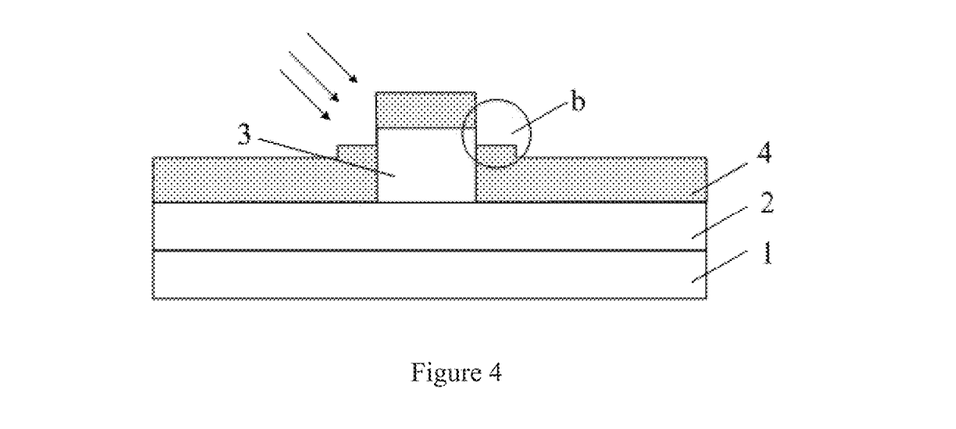
FIG. 4 is a schematic structural view of a non-display region of an array substrate after being damaged by external pressure according to an embodiment.

During the hot pressing process of the package layer, the data line 3 in the non-display region B is subjected to an external force, and the passivation layer 4 outside the data line 3 of the non-display region B is easily damaged by an external force to form a damaged portion b in the passivation layer 4 and the structure after the damage is shown in FIG. 4.

In this embodiment, there is a problem that the passivation layer outside the data line in the non-display region of the array substrate is easily to be broken and the data line is easily to be corroded.

The array substrate provided by the embodiments of the disclosure includes a base substrate, a wiring on the base substrate, a first insulating layer covering the wiring, and a protrusion on the first insulating layer and located in the non-display region of the array substrate. Wherein the protrusion is adjacent to the wiring, and wherein a surface, away from the base substrate, of the protrusion is further away from the base substrate than a surface, away from the base substrate, of a portion of the first insulating layer covering the wiring. The arrangement of the protrusions effectively prevents the first insulating layer (for example, the passivation layer) outside the wiring (for example, the data line) from being damaged by being pressed by an external force, thereby effectively preventing the wiring (for example, the data line) from being pressed by an external force and corroded by external water vapor, ensuring the normal use of wiring (for example, data lines).

Figure 11:
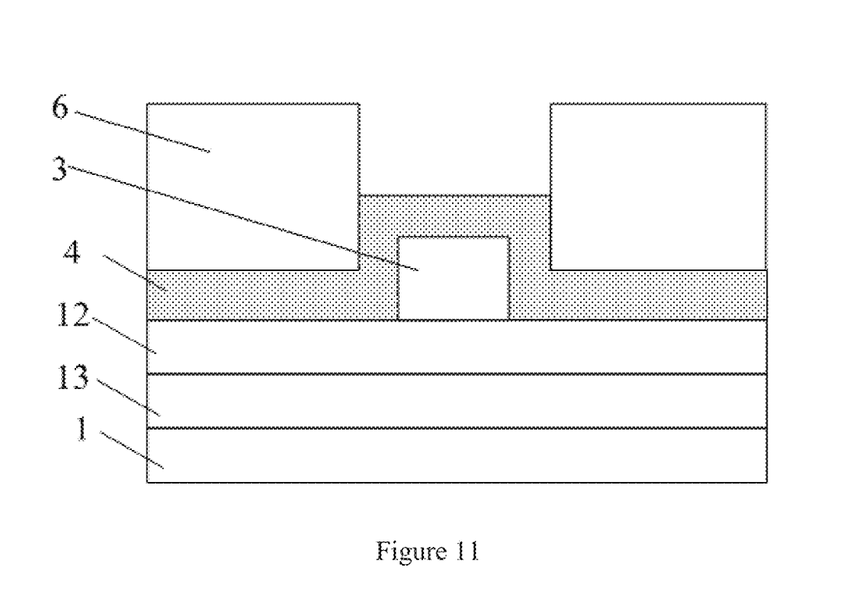
FIG. 11 is a schematic view of an array substrate according to an embodiment of the present disclosure.

A plurality of devices are disposed on the non-display region of the array substrate, the position of the wiring (for example, the data line) in the non-display region can be set according to the actual need, and the positions of the first insulating layer 4 (for example, the passivation layer) and the protrusion 6 in the non-display area are Accordingly arranged. As shown in FIG. 11, for example, a metal layer 13 for discharging static electricity may be disposed in a non-display region of the array substrate, and a second insulating layer 12 may be disposed on the metal layer. At this time, the wiring 3 such as the data line may be disposed on the second insulating layer 12 on the metal layer 13. Accordingly, the first insulating layer 4 such as a passivation layer may be covered on the wiring 3 (for example a data line) and the second insulating layer 12, and the protrusion 6 are disposed on the first insulating layer 4 (for example, a passivation layer). Other suitable positions of the wiring 3 (such as a data line), the first insulating layer 4 (such as the passivation layer), and the protrusion 6 can be used.

In embodiments of the present disclosure, a first insulating layer (e.g., a passivation layer) covers on a wiring (e.g., a data line), and a protrusion (which may also be referred to as a "protective layer") is disposed above the first insulating layer (for example, the passivation layer). There may be a variety of positional relationships between the protrusions and the wiring (e.g., data lines). For example, at least a portion of the orthographic projection of the wiring on the base substrate of the array substrate does not overlap with the orthographic projection of the protrusion on the base substrate. A first insulating layer (e.g., a passivation layer) outside the wiring (e.g., a data line) not covered by the protrusion may be provided with a via hole through which the wiring may connect with another conductive structure (e.g., a metal layer structure).

Figure 5:
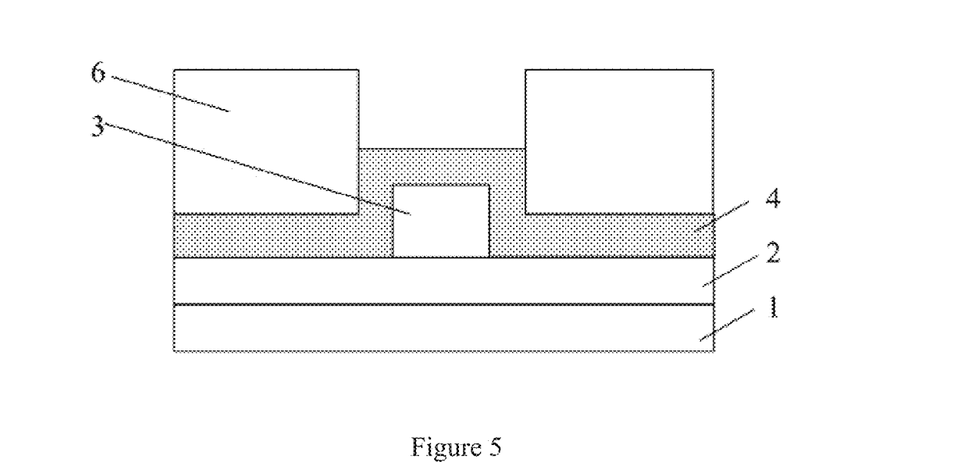
FIG. 5 is a schematic structural view of a non-display region of an array substrate according to an embodiment of the present disclosure.

Further, the protrusions may be disposed on both sides of the wiring, and the orthographic projection of the wiring on the base substrate does not overlap with the orthographic projection of the protrusion on the base substrate. FIG. 5 is a schematic structural view of a non-display region of an array substrate according to an embodiment of the present disclosure. As shown in FIG. 5, the protrusion 6 is provided on both sides of the wiring 3. The orthographic projection of the protrusion 6 on the base substrate 1 does not overlap the orthographic projection of the wiring 3 on the base substrate 1. The height of the protrusion 6 is higher than the height of the first insulating layer (for example, the passivation layer) 4 (that is, a surface of the protrusion 6 away from the base substrate 1 is further away from the base substrate than a surface, away from the base substrate 1, of a portion of the first insulating layer 4 covering the wiring 3). The protrusion 6 on both sides of the wiring 3 forms a groove with the first insulating layer 4 outside the wiring 3.

When the array substrate is fabricated, since the protrusions 6 on both sides of the wiring 3, such as the data line, in the non-display region is higher than the first insulating layer 4 on the outer side of the wiring 3, the protrusion 6 can buffer the external force applied by the process. The function of protecting the structure of the first insulating layer 4 is ensured, and the normal use of the wiring 3 in the first insulating layer 4 is also ensured.

Figure 6:
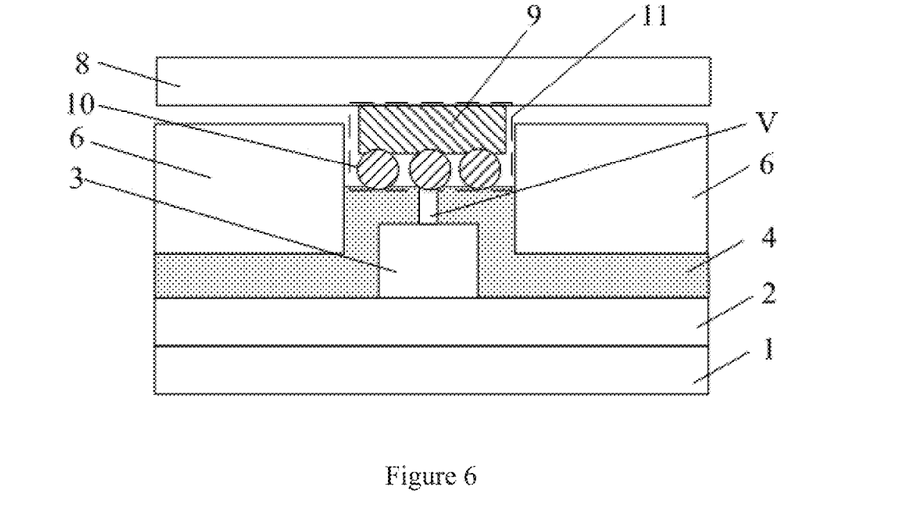
FIG. 6 is a schematic structural view of a circuit board and a module of the array substrate shown in FIG. 5.

As shown in FIG. 6, the array substrate may further include a circuit board 8 disposed on the protrusion 6. A conductive portion 11 is provided on the side of the circuit board 8 facing the wiring 3 (see the broken line frame of FIG. 6). The conductive portion 11 may include a metal wire 9 and a conductive paste 10, wherein the metal wire 9 may be fixed, through the conductive paste 10, in the groove formed by the protrusion 6 and the first insulating layer 4. At this time, the orthographic projection of the conductive portion 11 on the base substrate 1 is located between the orthographic projections of the protrusions 6 on the base substrate 1. A via hole V is disposed on the first insulating layer 4 outside the wiring 3. The metal line 9 fixed in the groove is connected to the wiring 3 through the conductive paste 10 and the via hole V in the passivation layer 4. The above structure realizes the alignment of the metal wires 9 and the grooves, and effectively prevents the circuit board 8 from moving.

Referring to FIG. 6 of the module structure formed by the array substrate and the above-mentioned circuit board, the metal wires 9 (for example, the gold fingers of the circuit board) and the conductive paste 10 are blocked by the protective layer 6 on both sides of the wiring 3 when bonding is performed. The protective layer 6 serves as a fixing function to prevent the metal wires 9 from being displaced from the wiring 3, thereby improving the offset and misalignment occurs at the time of bonding, and ensuring the positional accuracy at the time of bonding.

Figure 7:
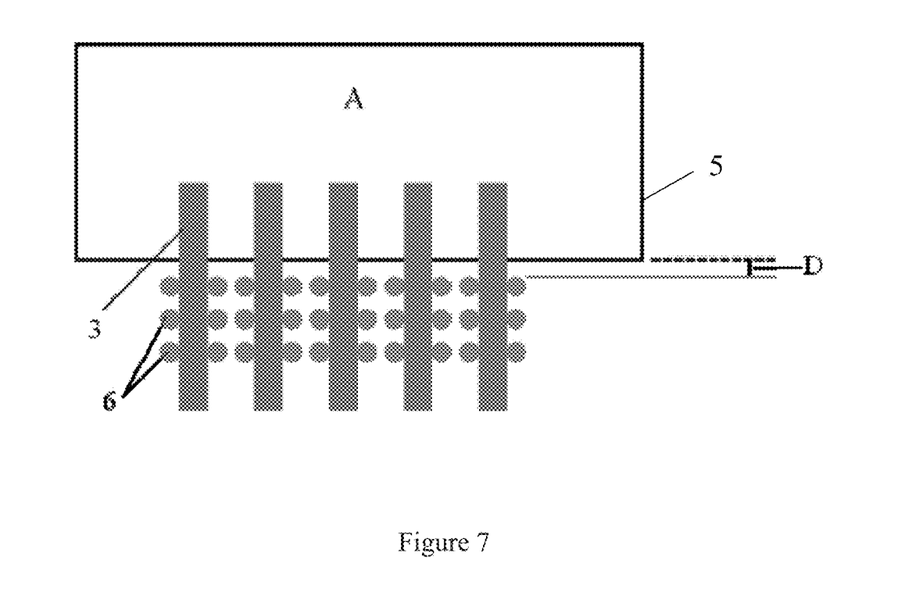
FIG. 7 is a first schematic structural view of a protective layer in a non-display region of an array substrate according to an embodiment of the present disclosure.
Figure 8:
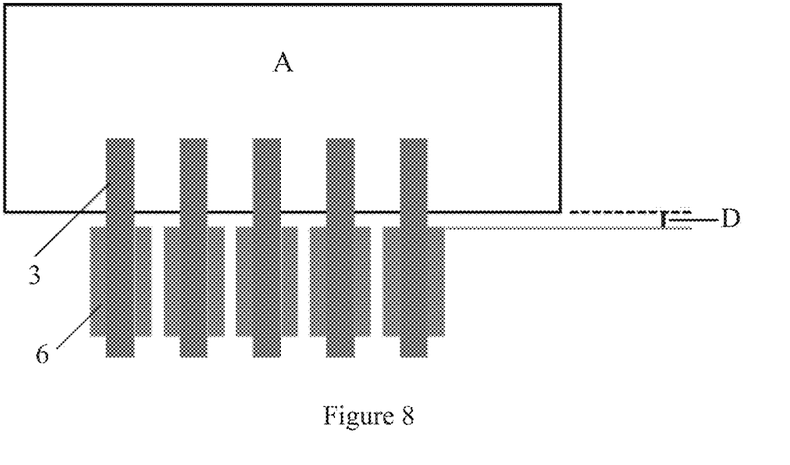
FIG. 8 is a second schematic structural view of a protective layer in a non-display region of an array substrate according to an embodiment of the present disclosure.
Figure 9:
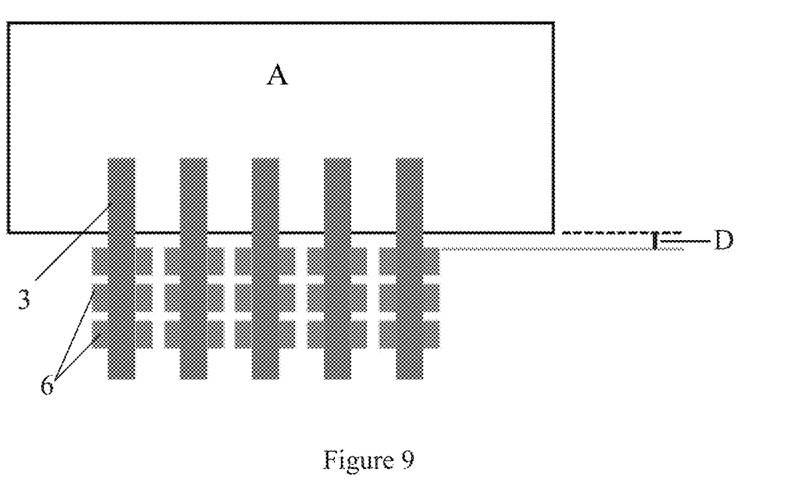
FIG. 9 is a third schematic structural view of a protective layer in a non-display region of an array substrate according to an embodiment of the present disclosure.

The protrusions are formed on both sides of the data line. The protrusions may be in a variety of pattern shapes. For example, the protrusion can be a sphere, a cylinder, or a cuboid. The plurality of protrusions may be continuous or islanded. The plurality of protrusions may be arranged in a regular or irregular arrangement. FIGS. 7-9 are schematic views showing the structure of the protrusion 6 in the non-display region of the array substrate. The protrusions 6 shown in FIGS. 7 to 9 are formed on both sides of the wiring 3 and are regularly arranged. The protrusion 6 shown in FIG. 7 has a cylindrical structure. The protrusion 6 shown in FIG. 8 has a continuous cuboid structure. The protrusion 6 shown in FIG. 9 has a cuboid structure.

The first insulating layer 4 may include a passivation layer. The wiring 3 may include a data line.

In the array substrate provided by the embodiments of the disclosure, the thickness of the protrusion may be greater than the thickness of the wiring, so that the protrusion protects the wiring regardless of the positional relationship between the protrusion and the wiring.

When the array substrate is fabricated, a package layer is disposed on the display region of the array substrate. In an embodiment of the disclosure, the distance between the protrusion and the package layer 5 is greater than a predetermined distance (the "distance" of the two refers to the minimum of the distance between the point on the protrusion and the point on the package layer). The above structure is arranged to ensure the package effect of the package layer and the array substrate of the display region, and prevent external water vapor from entering the display region to corrode the lines structure. The preset distance can be set according to the actual situation. As shown in FIGS. 7-9, the distance between the protective layer 6 and the package layer 5 is D. At the distance D, the package layer 5 can form a sealing structure with a good sealing property with the array substrate, thereby effectively preventing outside water vapor from entering the display region A, and ensuring the safety of the lines and devices in the display region A.

Figure 12:
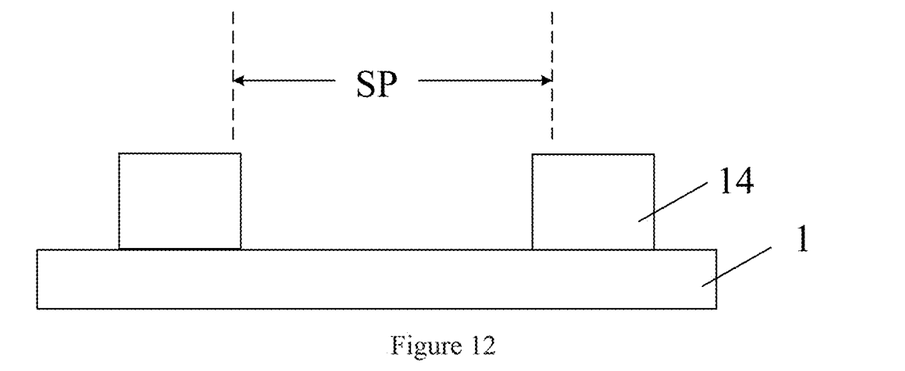
FIG. 12 is a schematic view of an array substrate according to an embodiment of the present disclosure.

The array substrate provided by the embodiment of the present disclosure may further include a pixel defining layer 14 that is located in the display region of the array substrate and defines the sub-pixel SP as shown in FIG. 12. In embodiments of the present disclosure, an organic light emitting diode structure layer may be disposed in a display region of the array substrate, and an organic light emitting diode structure layer may be disposed in a display region of the array substrate of the OLED display. The organic light emitting diode structure layer includes a pixel defining layer, and the pixel defining layer may be disposed in the same layer as the protrusion in the non-display region.

Specifically, during the fabrication of the structure in the display region of the array substrate, a TFT control layer, an anode layer, a color film, an organic light-emitting layer, and a cathode layer are formed on the base substrate. A pixel definition layer is required to be formed when the color film is prepared, and the pixel definition layer is used to separate sub-pixel (e.g., RGB) pixels. When forming the pixel defining layer in the display region, the protective layer can be simultaneously formed in the non-display region by one patterning process. Compared with the existing array substrate fabrication process, the embodiments of the present disclosure only needs to change the pattern of the mask of the pixel definition layer, and does not increase the preparation process.

In the array substrate provided by the embodiments of the disclosure, the protective layer and the passivation layer may be selected from the group consisting of a plurality of materials. For example, the protective layer may be a resin layer. When the protrusion in the non-display region and the pixel defining layer in the display region are formed by one patterning process, and the pixel defining layer is a polyimide (PDL) material layer, the protrusion is also a PDL layer. The first insulating layer, such as a passivation layer, may be a silicon nitride layer or a resin layer.

Figure 13:
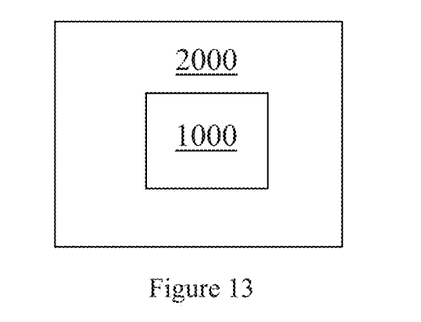
FIG. 13 is a schematic view of a display panel according to an embodiment of the present disclosure.

The embodiments of the disclosure further provide a display panel. As shown in FIG. 13, a display panel 2000 of embodiments of the present disclosure includes an array substrate 1000. The array substrate 1000 may include an array substrate as shown in FIGS. 5-9. The display panel 2000 has the advantages of the above array substrate which will not be described herein for the sake of brevity.

Figure 14:
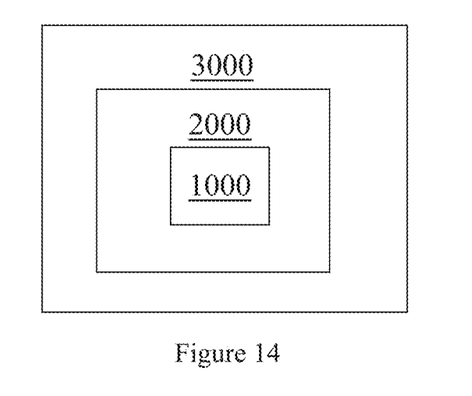
FIG. 14 is a schematic view of a display device according to an embodiment of the present disclosure.

Embodiments of the present disclosure also provide a display device. As shown in FIG. 14, a display device 3000 of embodiments of the present disclosure includes a display panel 2000. The display panel 2000 may include a display panel as shown in FIG. 13. The display device 3000 has the advantages of the above display panel which will not be described herein for the sake of brevity.

Figure 10:
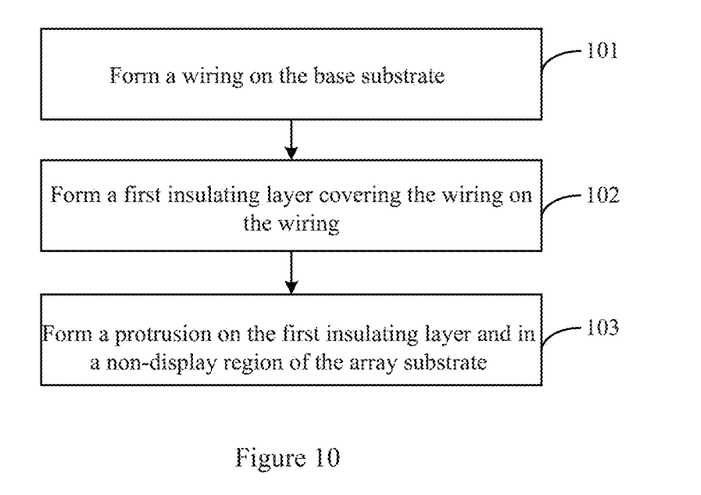
FIG. 10 is a flowchart of a method for fabricating an array substrate according to an embodiment of the present disclosure.

The embodiments of the disclosure further provide a method for fabricating the above array substrate. FIG. 10 is a flowchart of a method for fabricating an array substrate according to embodiments of the present disclosure. Referring to FIG. 10, the method for fabricating the array substrate includes:

101: Forming a wiring on the base substrate;

102: Forming a first insulating layer covering the wiring on the wiring; and

103: Forming a protrusion on the first insulating layer and in a non-display region of the array substrate, wherein the protrusion is adjacent to the wiring, and wherein a surface, away from the base substrate, of the protrusion is further away from the base substrate than a surface, away from the base substrate, of a portion of the first insulating layer covering the wiring.

In the embodiments of the present disclosure, the arrangement of the protrusion effectively prevents the first insulating layer (for example, the passivation layer) and the wiring (for example, the data line) from being pressed by the external force, thereby effectively preventing the problem that the data line corrosion due to external water vapor caused by the breakage of the passivation layer, ensuring the normal use of the data line.

The steps of forming the protrusion above the first insulating layer may include forming protrusions on the first insulating through a patterning process, the protrusions being located on both sides of the wiring.

At this time, the protrusions on both sides of the wiring and the first insulating layer on the outer side of the wiring form a groove structure. The array substrate may also include a circuit board. A metal wire is formed on the circuit board. Metal wires can be placed in the grooves to prevent the board from shifting.

When the organic light emitting diode structure layer is formed in the display region of the array substrate, and the organic light emitting diode structure layer includes the pixel defining layer, the step of forming the protrusion over the first insulating layer may include forming a protrusion on the first insulating layer in a non-display region while forming a pixel defining layer in a display region by one patterning process. The protrusion can be selected to include a plurality of sets of materials. For example, the protrusion may include a resin.

Compared with the existing array substrate fabrication process, the embodiment of the present disclosure only needs to change the pattern of the mask of the pixel definition layer, and does not increase the preparation process. When the protrusion is formed, the entire layer of the protrusion may be formed in the non-display region, and then the entire layer of the protrusion is processed by an exposure etching process to obtain a protrusion structure of a desired pattern.

The various embodiments in the present disclosure are described in a progressive manner, and each embodiment focuses on differences from other embodiments, and the same or similar parts between the various embodiments can be referred to each other.

The array substrate, the display panel, the display device, and the fabrication method thereof are provided in detail. The principles and embodiments of the present disclosure are described. The description of the above embodiments is only for helping to understand the method of the present disclosure and its core ideas. Meanwhile, for those of ordinary skill in the art, depending on the idea of the present disclosure, there will be changes in specific embodiments and applications. The contents of this disclosure are not to be construed as limiting the disclosure.

What is claimed is:

1. An array substrate comprising:
   a base substrate;
   a wiring on the base substrate;
   a first insulating layer covering the wiring;
   protrusions on the first insulating layer and in a non-display region of the array substrate, wherein the protrusions are adjacent to the wiring and are in direct contact with the first insulating layer, wherein the protrusions each have a first protrusion surface facing away from the base substrate, wherein the first protrusion surface is further away from the base substrate than a first surface of a first portion of the first insulating layer, wherein the first portion of the first insulating layer covers the wiring, wherein the first surface of the first portion is facing away from the base substrate, and wherein orthographic projections of the protrusions on the base substrate do not overlap with an orthographic projection of the wiring on the base substrate; and a pixel defining layer located in a display region and defining sub-pixels, wherein the pixel defining layer is disposed in the same layer as the protrusions.

2. The array substrate according to claim 1, wherein the protrusions are disposed on both sides of the wiring.

3. The array substrate according to claim 1, further comprising:
a circuit board disposed on the protrusions; and
a conductive portion disposed on a side, facing the wiring, of the circuit board, the conductive portion electrically connected to the wiring through a via provided on the first insulating layer, wherein an orthographic projection of the conductive portion on the base substrate is between the orthographic projections of the protrusions on the base substrate.

4. The array substrate according to claim 1, wherein thicknesses of the protrusions are larger than a thickness of the wiring.

5. The array substrate of claim 1, wherein a package layer is provided on a display region of the array substrate, and wherein a distance between the protrusions and the package layer is greater than a preset distance.

6. The array substrate according to claim 1, further comprising a metal layer between the base substrate and the wiring, and a second insulating layer between the metal layer and the wiring.

7. The array substrate according to claim 1, wherein shapes of the protrusions are selected from the group consisting of a sphere, a cylinder, and a cuboid.

8. The array substrate according to claim 1, wherein the protrusions comprise a resin.

9. The array substrate according to claim 1, wherein the wiring comprises a data line.

10. The array substrate according claim 1, wherein the first insulating layer comprises a passivation layer.

11. A display panel comprising the array substrate according to claim 1.

12. A display device comprising the display panel according to claim 11.

13. A method of fabricating an array substrate, the method comprising:
forming a wiring on a base substrate;
forming, on the wiring, a first insulating layer covering the wiring; and
forming protrusions on the first insulating layer and in a non-display region of the array substrate, wherein the protrusions are adjacent to the wiring and are in direct contact with the first insulating layer, and wherein the protrusions each have a first protrusion surface facing away from the base substrate, wherein the first protrusion surface is further away from the base substrate than a first surface of a first portion of the first insulating layer, wherein the first portion of the first insulating layer covers the wiring, wherein the first surface of the first portion is facing away from the base substrate, and wherein orthographic projections of the protrusions on the base substrate do not overlap with an orthographic projection of the wiring on the base substrate; and
forming a pixel defining layer located in a display region and defining sub-pixels, wherein the pixel defining layer is disposed in the same layer as the protrusions.

14. The method according to claim 13, wherein forming the protrusions on the first insulating layer comprises forming the protrusions on the first insulating layer through a patterning process, the protrusions located on both sides of the wiring.

15. The method according to claim 14, wherein the wiring comprises a data line, and wherein the first insulating layer comprises a passivation layer.

16. The method according to claim 13, wherein forming the protrusions on the first insulating layer comprises forming the protrusions on the first insulating layer in a non-display region while forming the pixel defining layer in a display region and defining sub-pixels by one patterning process.

17. The method according to claim 16, wherein the wiring comprises a data line, and wherein the first insulating layer comprises a passivation layer.

18. The method according to claim 13, wherein the wiring comprises a data line, and wherein the first insulating layer comprises a passivation layer.

* * * * *